United States Patent [19]

Garde

[11] Patent Number: 4,516,080

[45] Date of Patent: May 7, 1985

[54] HIGH-EFFICIENCY LOW DISTORTION PARALLEL AMPLIFIER

[75] Inventor: Peter Garde, Bronte, Australia

[73] Assignee: Unisearch Limited, Kensington, Australia

[21] Appl. No.: 480,365

[22] Filed: Mar. 30, 1983

[30] Foreign Application Priority Data

Apr. 1, 1982 [AU] Australia ............................... PF3423

[51] Int. Cl.³ .............................................. H03F 21/00
[52] U.S. Cl. ......................................... 330/3; 330/151
[58] Field of Search ........................... 330/3, 149, 151

[56] References Cited

U.S. PATENT DOCUMENTS

| | | | |
|---|---|---|---|
| 2,776,382 | 1/1957 | Jensen | 307/97 |
| 3,399,358 | 8/1968 | Rinehart | 330/149 |
| 4,378,530 | 3/1983 | Garde | 330/297 |

FOREIGN PATENT DOCUMENTS

| | | |
|---|---|---|
| 1055788 | 1/1967 | United Kingdom . |
| 2070373 | 9/1981 | United Kingdom . |

OTHER PUBLICATIONS

Camenzind, H. R., "Modulated Pulse Audio Power Amps for ICs", IEEE Trans. Audio Electacoust., vol. AU-14, pp. 136-140, 9/66.
Dutra, J. A., "Digital Amps for Analog Power", IEEE Trans. Consumer Elec., vol. CE-24, pp. 308-316, 8/78.
Mammano, R., "Simplifying Converter Design with New Integrated Regulating PWM", SG1524 Application Note, Silicon General, Inc.
Spijkerman, J. J., and Sturgeon, C. L., "The Stugeon Amp-a New Switching Technique", Proc. Powercon 4, pp. H3-1-H3-3, 5/77.
Rensink, L., et al., "Design of KW Off-Line Switch Using Cuk Converter", Proc. Powercon 6, pp. H3-1-H3-26, 5/79.
Cuk, S., "A New 0-Ripple Switching dc-dc Converter & Integrated Magnetics", IEEE Pwr. Elec. Conf., 1980, pp. 12-32.

Primary Examiner—James B. Mullins
Assistant Examiner—Steven J. Mottola
Attorney, Agent, or Firm—Holman & Stern

[57] ABSTRACT

A high-efficiency low-distortion parallel amplifier or regulator is driven by an input signal source $V_i$. An input signal passes to a linear circuit LC, and the output current $i_1$ from the linear circuit passes to the input of a switching circuit SC. Alternatively, the input to the switching circuit may be any other signal that is a function of the linear-circuit output current. The output of the switching circuit passes through a coupling network CN and is applied with the output current of the linear circuit to a load impedance ZL. The output of the switching circuit acts to reduce the output current of the linear circuit so that the power it supplies is low. A low linear-circuit output current is usually sufficient to drive the switching circuit and coupling network to the maximum current required by the load. The system automatically adjusts independently of the load impedence so that with high output current most of the current is supplied by the switching circuit.

32 Claims, 20 Drawing Figures

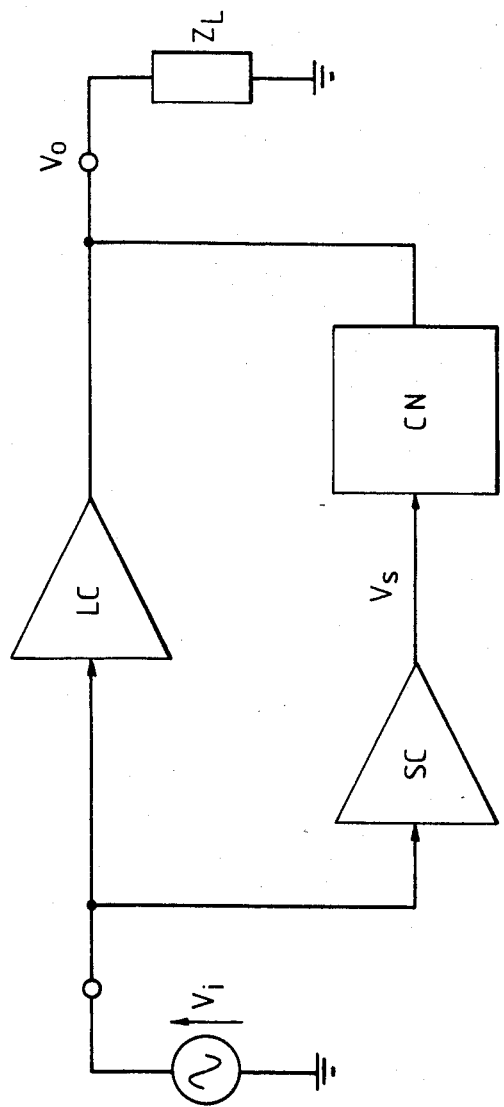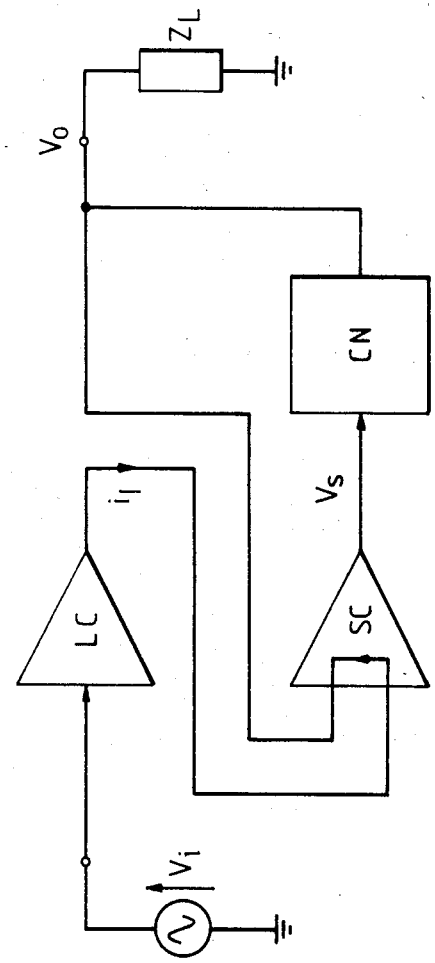
Fig.1.
PRIOR ART
Fig.2.

HIGH-EFFICIENCY LOW DISTORTION PARALLEL AMPLIFIER

This invention relates generally to amplifiers, and in particular audio power amplifiers, the power amplifiers employed in inverters, dc power converters, and voltage regulators. The invention is specifically concerned with obtaining the attributes of high efficiency together with low distortion in the case of an amplifier, or with low output ripple in the case of a regulator. With this invention it is possible to build high-performance amplifiers and regulators of low cost, small size, low weight and high reliability of operation. Other advantages are also achieved by the use of this invention.

In the prior art of amplifier and regulator technology it has been difficult to achieve high-efficiency operation simultaneously with low distortion or low ripple. (In the context of the disclosure of this invention, low distortion or low ripple occurs when the amplifier or regulator output closely approximates the desired output.) High efficiency means that there is little wasted power. High efficiency is desirable because minimal power is consumed, the electrical requirements of the associated power supply are minimal, and the hardware requirements for dissipating the wasted power are small. This leads to the attributes noted above. Low distortion or low ripple is a necessary performance parameter of amplifiers or regulators in many practical applications.

In the prior art high-efficiency amplifiers and regulators have been of the switching type; the active power devices of these systems operate in a switching rather than a linear mode. Switching (also known as class-D) amplifiers and regulators may either be of the pulse-width-modulation type (see, for example: H. R. Camenzind, "Modulated pulse audio power amplifiers for integrated circuits", IEEE Trans. Audio Electroacoust., vol. AU-14, pp. 136–140, September 1966; J. A. Dutra, "Digital amplifiers for analog power", IEEE Trans. Consumer Elec., vol. CE-24, pp. 308–316, August 1978; R. Mammano, "Simplifying converter design with a new integrated regulating pulse width modulator", SG1524 Application Note, Silicon General Inc.) or alternatively, of the self-oscillating type (see, for example: A. G. Bose, "Signal translation apparatus", British Pat. No. 1,055,788, Jan. 18, 1967; J. J. Spijkerman and C. L. Sturgeon, "The Sturgeon amplifier—a new switching technique", Proceedings of the Fourth National Solid-State Power Conversion Conference (Powercon 4), pp. H3-1-H3-3, May 1977; J. L. Jensen, "Voltage and current regulation", U.S. Pat. No. 2,776,382, January 1, 1957). In this context the term pulse-width modulation is synonymous with driven or synchronous, and the term self oscillating is synonymous with free-running or ripple. Switching amplifiers have failed to become popular for high-fidelity audio applications for two reasons: their distortion is too high (and is not readily reduced by simply applying high levels of negative feedback) and their output contains considerable unwanted high-frequency (hf) energy. Similarly, switching regulators are plagued by high ripple and significant hf energy in their output. A further problem with switching amplifiers and regulators is their inferior large- and small-signal transient responses compared with those of their linear counterparts. It is an object of the present invention to ameliorate some or all of these defects of switching amplifiers and regulators.

The present invention combines low-efficiency linear circuits with high-efficiency switching circuits, such a combination being referred to here as a hybrid system. In the present invention the output ports of linear and switching circuits are connected together via one or more coupling networks, both circuits supplying power in a parallel manner to a load and thus forming a parallel hybrid system. The efficiency of this system is high because the output current is predominantly supplied via the switching circuits; the linear circuit operates with low average output current. A different method of realising a hybrid system, a series hybrid system, is the subject of a previous invention (see: P. Garde, "High-efficiency low-distortion amplifier", Australian Patent Application No. 59694/80, June 26, 1980). In this previous method the outputs of switching circuits drive the supply rails of the output stage of a linear circuit thereby reducing the voltage across the output stage and achieving high efficiency. Power is supplied in a series manner from the switching circuits to the linear circuit and from there to the load. Both parallel and series hybrid systems have low distortion or ripple in their output signals because this depends upon their linear circuits, rather than their switching circuits alone; the linear circuits correct any error in the output of the switching circuits. As the linear circuits only operate at a power level sufficient to counteract the error in the output of the switching circuits, the power wasted by the linear circuits is very small compared with the power capability of the system, and high efficiency is obtained.

If very high efficiency is required, the parallel and series hybrid systems may be combined. In this scheme the linear circuit of a parallel hybrid system may itself be a series hybrid system. Alternatively, the linear circuit of a series hybrid system may be a parallel hybrid system. Similarly, more than two hybrid systems may be combined; however, such arrangements possess the disadvantage of high complexity.

The present invention may be employed in the realisation of a parallel hybrid amplifier or regulator. The circuitry of a hybrid regulator is usually simpler than that of a hybrid amplifier because a regulator need only supply output current in one direction; however the linear circuit of a hybrid regulator requires a reference source.

The present invention consists in a high-efficiency low-distortion parallel amplifier or regulator system comprising a high-efficiency switching circuit, a low-distortion linear-amplification means, a coupling network, and a coupling node, wherein a system input signal or regulator reference voltage is fed to an input port of the linear-amplification means, or wherein a reference voltage is generated within said linear-amplification means, and wherein an output voltage signal produced at an output port of the linear-amplification means is adapted to be fed to a load via a system output port, and a signal which is a function of a current flowing in the output port of the linear-amplification means is fed to an input port of the switching circuit, and a switching output current flowing in the output port of the switching circuit is fed predominantly to the coupling node which is disposed between the output port of the linear-amplification means and the system output port, at which node the switching output current is combined with the current flowing in the output port of the linear-amplification means to produce a system output current which flows via the system output port to the load, the switching output current having a maximum time rate of change limited by the coupling network which is either incorporated into the switching circuit or alternatively is provided between the output port of the switching circuit and the coupling node, the amplifier or regulator system further characterised in that the system output current when averaged over a period of time is substantially supplied by the switching circuit when said averaged output current is large.

In particular embodiments of the present invention, low-pass-filter means can be incorporated into the linear-amplification means to attenuate high-frequency noise such as switching noise entering an input port of the linear-amplification means.

Particular embodiments of the present invention can also include low-pass-filter means provided between the coupling node and the system output port.

In particular embodiments of the present invention a plurality of switching circuits can be provided in parallel connection, the output current of each switching circuit being fed predominantly to the coupling node and having a maximum time rate of change limited by a coupling network, the number of coupling networks provided being less than or equal to the number of switching circuits.

It will be apparent to those skilled in the art that there are many different techniques for realising the present invention and that embodiments may be produced with many different features, the choice of those features for a particular application being dependent upon the use to which the system is to be put. Some of these techniques and features will now be discussed by way of example; however, it is not intended that the invention be limited to these examples.

Embodiments of the present invention may include a low-pass filter at their inputs. This filter attenuates any hf noise such as that which originates from hf signal sources or switching of electric currents.

The peak-current capability of the linear circuit of particular embodiments of the present invention may be of almost any value, high or low, in any given application. In all cases the average power dissipated by the linear circuit can be low and thus high efficiency achieved. The advantage of a high-current capability is that the switching circuits and coupling networks can have a slow response. A slow network response infers that the network greatly attenuates the switching transients. In this case it is easy to keep the switching frequency low, thus minimising switching losses. Under transient or other input signal conditions which are too fast for the switching circuits and coupling networks, the distortion is kept low by high currents supplied by the linear circuit. As transients form only a small proportion of the input signal in most practical applications, such as in audio systems, these high currents do not add significantly to the average power dissipated by the linear circuits.

If the linear circuit is designed with a low-peak-current capability, the cost of the linear circuit is low; the linear circuit may be a low-power integrated-circuit amplifier. In this case, if the system is to respond linearly to fast signals, the response of the switching circuits and coupling networks must also be fast. A problem with conventional power amplifiers of the prior art is the difficulty of stabilising the bias current of the output devices. The problem is particularly severe with high-power amplifiers. The present invention substantially eases the difficulty because the linear circuit of a high-power amplifier or regulator need only have low-power capability. For the same reason the problem of secondary breakdown in the output transistors of a high-power amplifier is also greatly reduced. In addition, it is simple to fabricate a very fast linear circuit when its output requirement is low. The advantage of a fast linear circuit is that a large amount of negative feedback can be employed and very low distortion achieved; switching transients are greatly attenuated.

It is unnecessary that the system utilise negative feedback to realise the present invention; the requirement for substantial attenuation of the noise and distortion from the switching circuits at a given frequency is that the linear-circuit output impedance be small compared with that of the coupling networks at that frequency. Nevertheless, in most applications this requirement is most easily met and high performance obtained by the judicious use of negative feedback around the linear circuit. The linear circuit may include more than one negative-feedback loop. In particular, the use of multiple feedback loops which all include the node to which the coupling networks from the switching circuits are connected may greatly reduce the noise and distortion from the switching circuits. At audio frequencies, for example, the loop gain around the node may thereby be increased to almost any desired degree and the switching noise and distortion correspondingly reduced to virtually any desired level.

Within the switching circuit the control signals of the switching devices may be derived so that the circuit operates in either pulse-width-modulation or self-oscillating mode; several other modes of operation are also possible.

Dc isolation between the power source and the terminals of an amplifier or regulator is a requirement in many applications of the present invention. The switching circuits of particular embodiments of the invention may be designed so that they inherently possess dc isolation. In this case the use of a large heavy mains-frequency power transformer or an hf switching supply to power the system are avoided.

It is a requirement of the present invention to limit the time rate of change of the output currents of the switching circuits. This may be achieved by including inductance in series with the switching-circuit outputs within the coupling networks. The maximum time rate of change is a strong function of the difference between the switching-circuit supply voltage and the system output voltage. To avoid unduly limiting the large-signal (power) bandwidth of the system when driving a load it may be desirable for the switching circuits to be connected to higher supply voltages than those which power the linear circuit.

The average switching frequency may be reduced and switching losses minimised if the supply voltage of the switching circuit is varied as a function of the load voltage and of the time rate of change of the load current. Continuous or discrete-level supply-voltage variation is possible. For example, a selection of discrete voltages may be available to power the switching circuits, the most appropriate voltage at any instant in time being fed to the switching circuits by suitable logic circuitry.

The average switching frequency may also be reduced and switching losses minimised if two or more switching circuits and coupling networks are operated in parallel. The various switching circuits and their coupling networks may or may not be of different design and thus may switch at different switching-circuit input levels and have different response speeds. When a fast response is required more than one switching circuit may turn on to supply the output, or alternatively, a single switching circuit and coupling network with an appropriately fast response may supply the output. The switching circuits may be powered from the same or different supply voltages.

If two or more switching circuits and coupling networks operate in parallel, means may be provided so that when the load current is high the current is shared between the circuits according to their capabilities.

At high frequencies it may be desirable for the voltage transfer functions of the coupling networks to be low pass, although coupling networks should not exhibit undue time delay for the particular application. One purpose of a low-pass transfer function may be to attenuate hf switching noise coupled from a switching circuit to the system output. Another purpose may be to reduce the linear-circuit peak-current requirement. If the low-pass-filter cut-off frequencies are low compared with the switching frequency, the current requirement of the linear circuit is similarly low as long as it is unnecessary for the system to respond to transients or other fast signals. This may be the situation with a voltage regulator, particularly if its output is capacitively bypassed, for example.

Embodiments of the present invention may include a low-pass filter at the output between the coupling network and the load. Such a filter attenuates the hf noise fed to the load and decouples the load from the system feedback; the effect of the hf impedance of the load on system performance is minimised. For maximum attenuation of the noise the cut-off frequency of the filter must be as low as possible, the limiting frequency being set by the required large-signal bandwidth of the system. This is usually considerably below the required small-signal bandwidth (cut-off frequency) of the system.

If the filter cut-off frequency is to be below the system small-signal bandwidth then the filter characteristic must be equalised elsewhere in the system. Exact equalisation is often difficult to achieve, particularly if the load impedance is not well defined. To avoid this difficulty the filter may be enclosed in a negative-feedback loop. Provided that the loop has sufficient gain, the desired system small-signal bandwidth can be attained. The negative-feedback loop enclosing the filter may or may not be the only loop enclosing the linear circuit. When a feedback loop encloses the filter the load is an integral part of the negative-feedback loop at high frequencies. It may therefore be desirable to decouple the load at such frequencies with another low-pass filter.

Embodiments of the present invention may include special circuitry to protect the system from failure such as is possible during signal overdrive, overload conditions, or high-temperature operation.

The present invention will now be described more fully, by way of example only, with reference to preferred embodiments as shown in the accompanying drawings, and in which:

FIG. 1 is a block diagram of a prior art high-efficiency low-distortion amplifier;

FIG. 2 is a block diagram of an embodiment of the invention;

Figure 3:
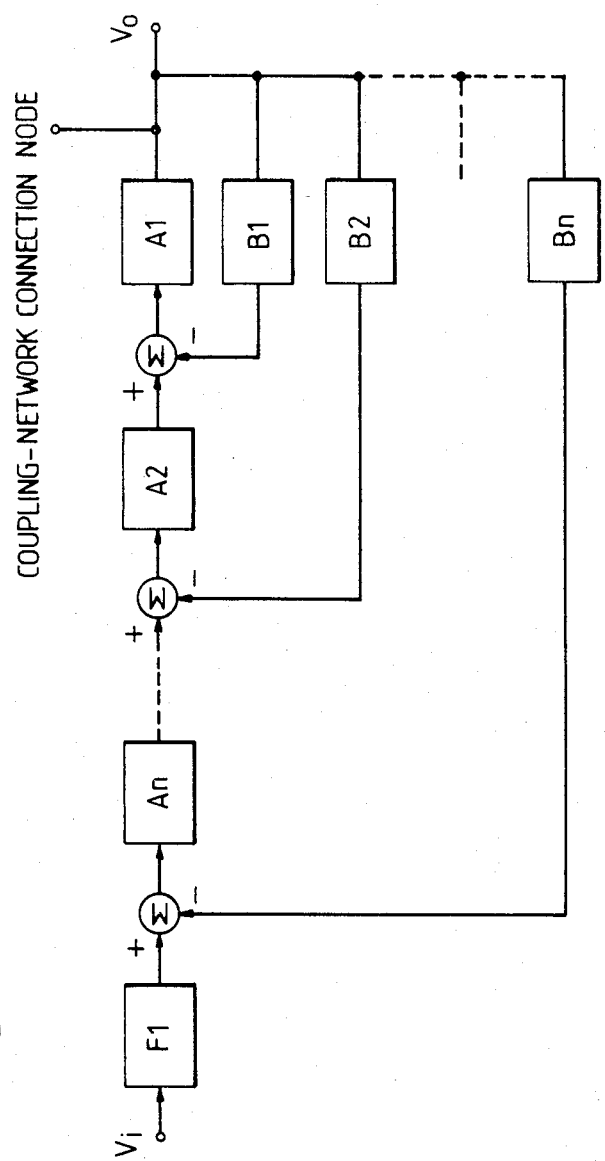
FIG. 3 is a block diagram of a linear circuit utilising multi-loop negative feedback and an input filter.

Consider the proposed design for a high-efficiency low-distortion amplifier shown in FIG. 1. The amplifier is driven by an input signal source $v_i$. The input signal passes to the linear circuit LC and the switching circuit SC. The switching circuit draws negligible power from the input-signal source and by a very efficient switching process generates an output signal $v_s$ which is an approximately linear function of $v_i$ plus noise and distortion components. The switching circuit is able to provide sufficient power to drive the load impedance $Z_L$ as desired.

The linear circuit amplifies the input signal and applies it to the load. The transfer function $v_o/v_i$ of the linear circuit is also that of the overall amplifier. It is unnecessary for the linear circuit by itself to be capable of driving the load because most of the output power is supplied by the switching circuit. Although the linear circuit has low efficiency this does not appreciably degrade the efficiency of the overall system because the average power supplied by the linear circuit is low. On the other hand the linear circuit has the benefit of low distortion. As the linear circuit determines the system output signal, any noise or distortion components from the switching circuit appear across the coupling network CN and any resulting currents are absorbed by the linear circuit and therefore do not pass to the load. For these reasons the overall system has both high efficiency and low distortion.

The coupling network interposes impedance between the linear- and switching-circuit outputs. This avoids large circulating currents when the circuit outputs are unequal and decouples the linear and switching circuits to help avoid hf oscillation when the linear circuit utilises negative feedback. It is desirable that a coupling network be a pure-reactance network otherwise system efficiency is degraded. The load impedance together with the transfer functions of the coupling network and the overall amplifier determine the required transfer function of the switching circuit with the assumption that ideally the linear circuit does not supply power to the load.

There are two serious problems with the amplifier shown in FIG. 1. First, if there is a finite tolerance on the significant amplifier-component parameters or on the load impedance, or if the delay times of the linear and switching circuits (from amplifier input to output) are unequal, then the linear circuit may be forced to supply a large current to the load and/or switching circuit. As a consequence system efficiency is degraded. Second, the design and behaviour of the amplifier depends critically on the load impedance. In practice this impedance is poorly defined and may vary over wide limits. The application of the amplifier of FIG. 1 is severely limited by both of these problems. It is an object of the present invention to overcome them.

An embodiment of the present invention, a high-efficiency low-distortion parallel amplifier or regulator, is shown in FIG. 2. In comparison with FIG. 1 it is apparent that the transfer function $v_o/v_i$ of the linear-circuit is again that of the overall amplifier; however, the input of the switching circuit SC is the linear-circuit output current $i_1$ rather than the input voltage $v_i$. Alternatively, the input to the switching circuit may be any other signal that is a function of the linear-circuit output current. The principle of operation of the present invention is that the output of the switching circuit generally acts to reduce the output current of the linear-circuit so that the power it supplies is low. With the invention a finite tolerance on system components is allowable because system operation does not depend critically upon matching or tracking of transfer functions within the system. Also, system performance is not unduly affected by the load impedance because a low linear-circuit output current is usually sufficient to drive the switching circuit and coupling network to the maximum current required by the load. Independent of the load impedance, the system automatically adjusts so that with high output current most of the current is supplied by the switching circuit.

While the linear circuit used in embodiments of the present invention may be a linear amplifier of conventional design, it is nevertheless advantageous if it is specially designed to attenuate the noise and distortion from the switching circuits. One example of such a design, a multi-loop negative-feedback linear-circuit with an input filter, is shown in FIG. 3. The low-pass filter F1 at the input attenuates hf noise entering the system input. In the forward path of the circuit there are n amplifying stages A1 to An. The feedback networks B1 to Bn complete the n loops which include the coupling-network connection node. In this arrangement the total loop gain around the node may be very high, well in excess of Bode's limit for a single feedback loop, so the noise and distortion from the switching circuits via the coupling networks are reduced to a low level. The arrangement must be carefully designed to avoid oscillation; design procedures are well known to those skilled in the art.

A parallel hybrid system may supply uni- or bi-directional current to the load. Usually a system which supplies only uni-directional current is simpler than a bi-directional current system. A dc power supply is an example of a uni-directional-current system and an audio amplifier is an example of a bi-directional-current system.

Independent of whether a parallel hybrid system is designed to supply uni- or bi-directional current to the load, the output current of the associated linear-circuit may itself be uni- or bi-directional. The advantage of a system whose linear-circuit current is uni-directional may be simple implementation. The advantage of a bi-directional linear-circuit current may be very high efficiency. The nature of the linear-circuit current is determined by the design of the switching circuits and coupling networks.

There is considerable freedom in the biasing arrangements of a linear-circuit output stage of a system which supplies bi-directional current; class-A, -B, or -AB biasing is possible, for example. When a linear circuit which supplies uni-directional current is used, a novel class-A arrangement may be employed wherein the output stage is single ended with the bias current supplied by the switching circuits, via the coupling networks.

Figure 4:
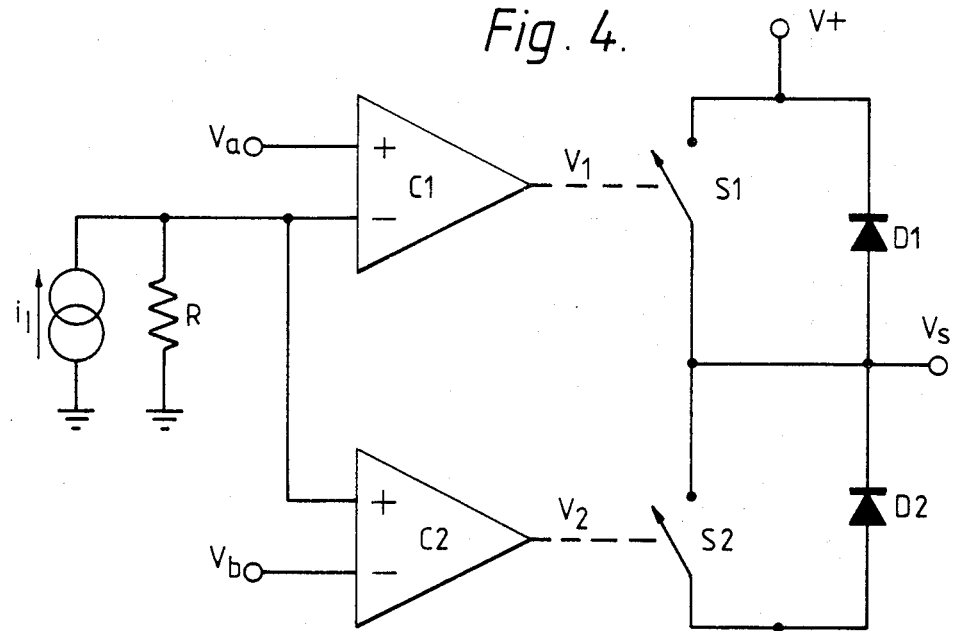
FIG. 4 is a partial schematic of a pulse-width-modulator switching circuit.

There are many ways of implementing the switching circuit; operation may be based upon pulse-width-modulation or self-oscillating principles, for example. The partial schematic of one arrangement for implementing a pulse-width-modulator switching circuit for a system which can supply bi-directional current is shown in FIG. 4. The comparators C1 and C2 compare a voltage proportional to the linear-circuit output current with two oscillatory waveforms $v_a$ and $v_b$ which may have appreciable dc components. The comparator outputs $v_1$ and $v_2$ operate two switches S1 and S2, a high output voltage causing a switch to open. The clamp diodes D1 and D2 avoid extreme voltage swings of the switching-circuit output when driving an inductive coupling network.

Figure 5:
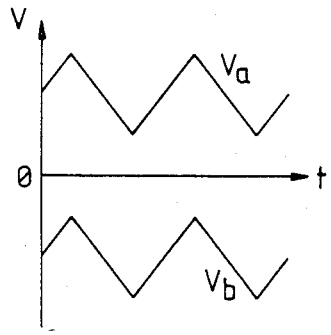
FIG. 5 is a diagram showing examples of voltage waveforms $v_a$ and $v_b$ of a pulse-width-modulator switching circuit as a function of time.
Figure 5:
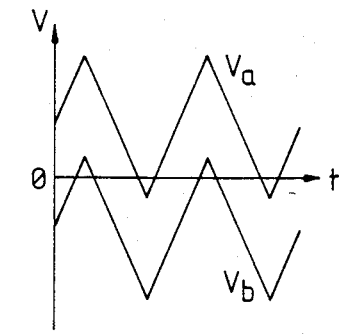
Figure 5:
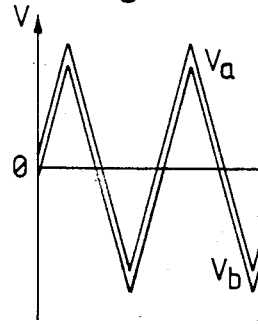
Figure 5:
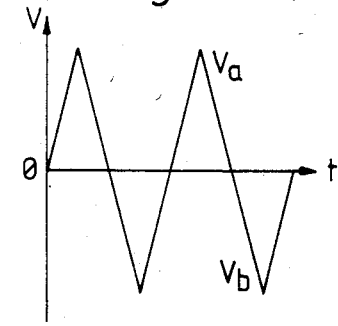

Examples of voltage waveforms suitable for $v_a$ and $v_b$ when the linear circuit supplies bi-directional current are shown as a function of time t in FIG. 5. Although the waveforms are triangular many other waveform shapes are equally suitable. However, for proper operation it is desirable that $v_a$ should always be more positive than $v_b$ at any instant. In the first example FIG. 5($a$), there is no output from the switching circuit at low input-signal levels and the linear circuit alone drives the output. This feature avoids switching noise and distortion at low signal level. In the second example FIG. 5($b$), switching occurs at all signal levels. In the third example FIG. 5($c$), the waveforms $v_a$ and $v_b$ are almost identical. If the waveforms are identical as shown in FIG. 5($d$), either S1 or S2 is closed at any given instant and therefore D1 and D2 are redundant. The disadvantage of identical waveforms is that non-ideal behaviour of the switches may cause their conduction periods to overlap and result in current flow between the supply rails V+ and V−. By slightly offsetting the waveforms as shown in FIG. 5($c$), this problem is avoided. While it is unnecessary that $v_a$ and $v_b$ be in phase, this is nevertheless desirable if $v_a$ is to be always more positive than $v_b$. In addition, when $v_a$ and $v_b$ are in phase the least time that switches S1 and S2 are both off is maximised, and conduction overlap is most unlikely.

If the switching circuit operates in the self-oscillating mode then it is unnecessary to generate two oscillatory waveforms. The partial schematic of FIG. 4 is also suitable for implementing a self-oscillating switching circuit if $va$ and $vb$ are dc voltages and if comparators C1 and C2 have appreciable hysteresis. This switching circuit is suitable for a self-oscillating system which can supply bi-directional current.

Figure 6:
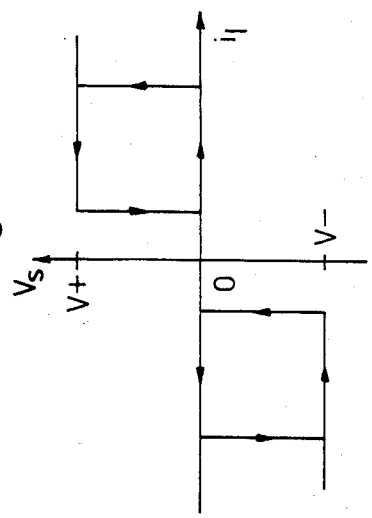
FIG. 6 is a diagram showing examples of transfer characteristics of a self-oscillating switching circuit when driving a resistive load.
Figure 6:
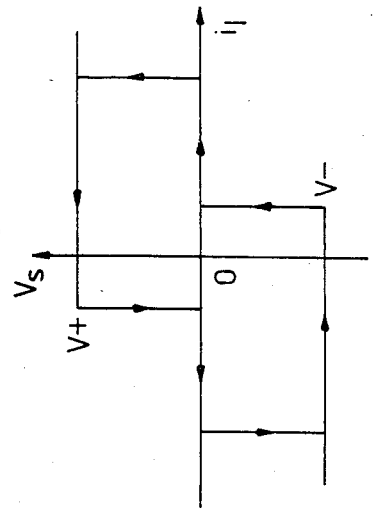
Figure 6:
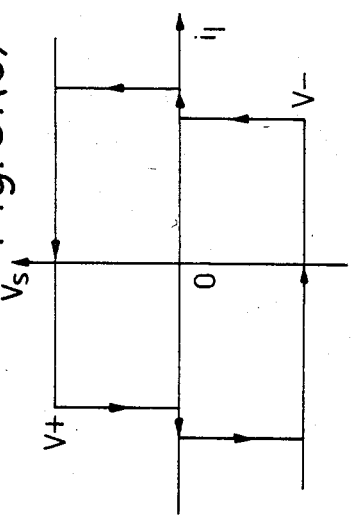
Figure 6:
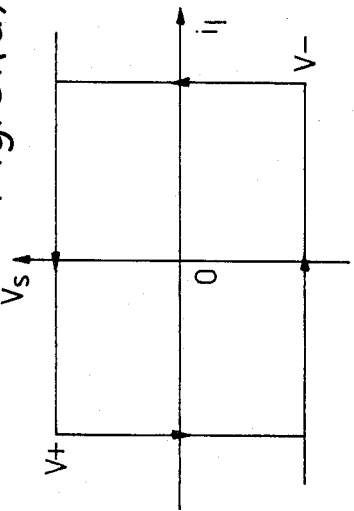

Examples of the transfer characteristics of a self-oscillating switching circuit driving a resistive load, when the associated linear circuit supplies bi-directional current, are shown in FIG. 6. In the first example FIG. 6($a$), switch S1 closes when the linear-circuit output current is sufficiently large. When the current subsequently reduces to a low value, switch S1 opens. Switch S2 closes when the current is large and negative, and it opens when the current becomes small. At low input-signal levels there is no output from the switching circuit and in this situation, as with the scheme associated with FIG. 5($a$), switching noise and distortion are avoided. In the second example FIG. 6($b$), switching occurs at all signal levels. In the third example FIG. 6($c$), the magnitudes of the currents at which the switches open and close are almost equal. If the current magnitudes are equal as shown in FIG. 6(d), the transfer characteristic degenerates into a single hysteresis loop. In this case either S1 or S2 is closed at any given instant and therefore D1 and D2 are redundant. The disadvantage of this type of operation is that conduction overlap of the switches may result in current flow between the supply rails. By making the current magnitudes unequal as shown in FIG. 6(c), this problem is avoided.

The pulse-width-modulator switching circuit shown in the partial schematic of FIG. 4, which may be adapted for operation in the self-oscillating mode, is suitable for systems supplying bi-directional current. If only uni-directional current is supplied, the circuit may be simplified. In particular, one comparator together with its associated switch is redundant and only one voltage $v_a$ or $v_b$ is required. The voltage waveforms of FIG. 5 and the transfer characteristics of FIG. 6 may be appropriately modified to correspond with this simplification. It is apparent that in general the magnitude of the current extremes of the linear circuit are determined independently by the switching circuit and in this respect there is considerable design flexibility.

In a particular application it may be advantageous if the switching-circuit voltages $v_a$ and $v_b$ are a function of the system operating conditions. For example, if the magnitudes of $v_a$ and $v_b$ decrease as temperature increases, the power dissipated by the linear circuit reduces and stress on the linear circuit is relieved.

Embodiments of the present invention may be designed so that they possess dc isolation between the power source and the system terminals by including an hf transformer within the switching circuit; additional isolation devices may also be required. Methods of embedding an hf transformer within a switching circuit are well known (see, for example: L. Rensink et al, "Design of a kilowatt off-line switcher using a Cuk converter", Proceedings of the Sixth National Solid-State Power Conversion Conference (Powercon 6), pp. H3-1–H3-26, May 1979; S. Cuk, "A new zero-ripple switching dc-to-dc converter and integrated magnetics", IEEE Power Electronics Specialists Conference, 1980 Record, pp. 12–32). The linear circuit may be powered from a low-power auxiliary supply. Thus dc isolation between the power source and the system terminals is readily achieved without the disadvantages of a large heavy mains-frequency transformer.

Figure 7:
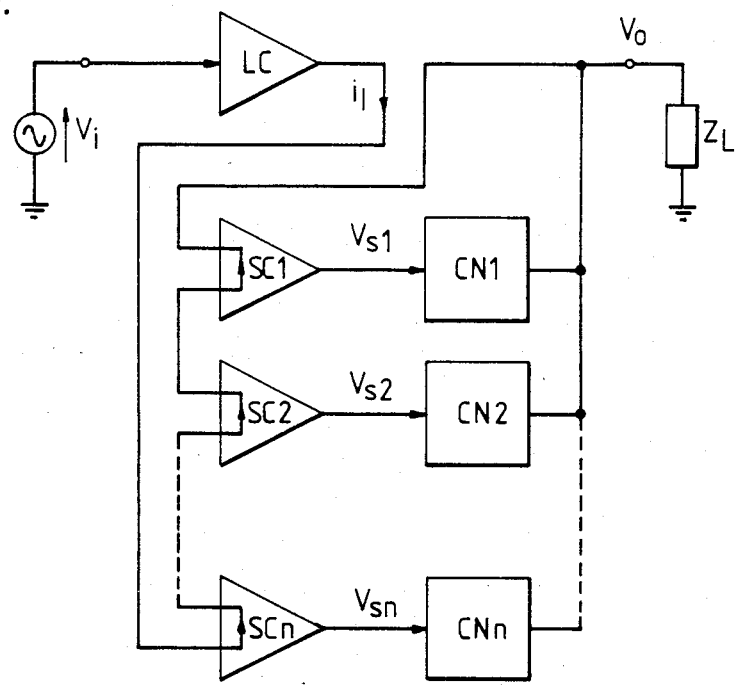
FIG. 7 is a block diagram of an embodiment of the invention incorporating multiple switching circuits and coupling networks.

Embodiments of the present invention may have multiple switching circuits and coupling networks operating in parallel as shown in FIG. 7. The input to each of the switching circuits SC1 to SCn and their associated coupling networks CN1 to CNn is the linear-circuit output current $i_l$. The output currents from the coupling networks add together at the system output.

Figure 8:
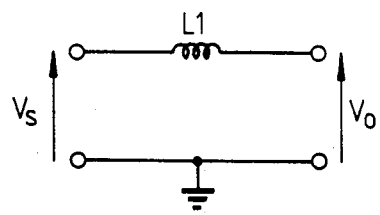
FIG. 8 is a circuit diagram of two coupling networks.
Figure 8:
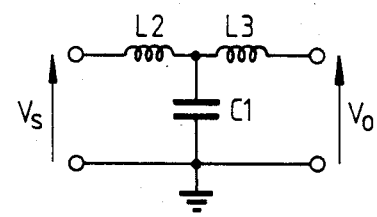

Two realisations of coupling networks are shown in FIG. 8. A very simple realisation FIG. 8(a) consists of an inductor L1 connected between the input and output ports. The more complex realisation FIG. 8(b) includes an additional inductor L2 and capacitor C1. These increase the attenuation of hf switching noise from the switching circuit. If desired, additional LC sections may be included in the coupling network.

Figure 9:
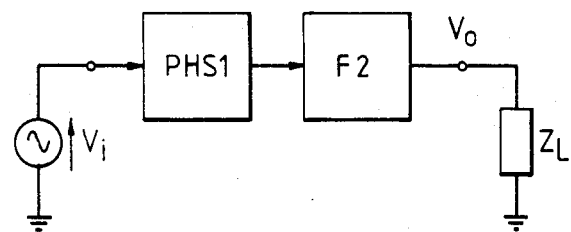
FIG. 9 is a block diagram of an embodiment of the invention incorporating various output filtering arrangements.
Figure 9:
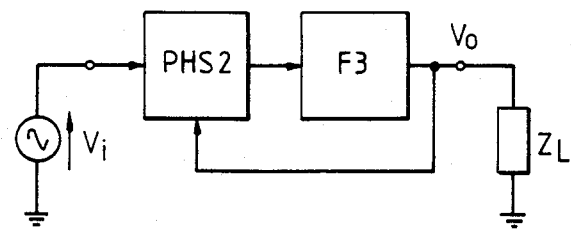
Figure 9:
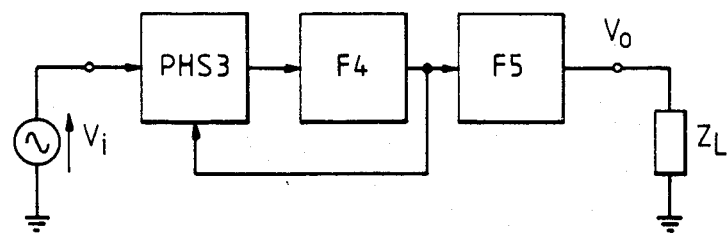

Embodiments of the present invention may include various filters connected at the output of the amplifier or regulator system as shown in FIG. 9. In FIG. 9(a) a low-pass filter F2 is connected in series with the output of the parallel hybrid system PHS1. In FIG. 9(b) the low-pass filter F3 is enclosed in a negative-feedback loop. In FIG. 9(c) the load is decoupled by filter F5 from the negative-feedback loop enclosing filter F4.

Figure 10:
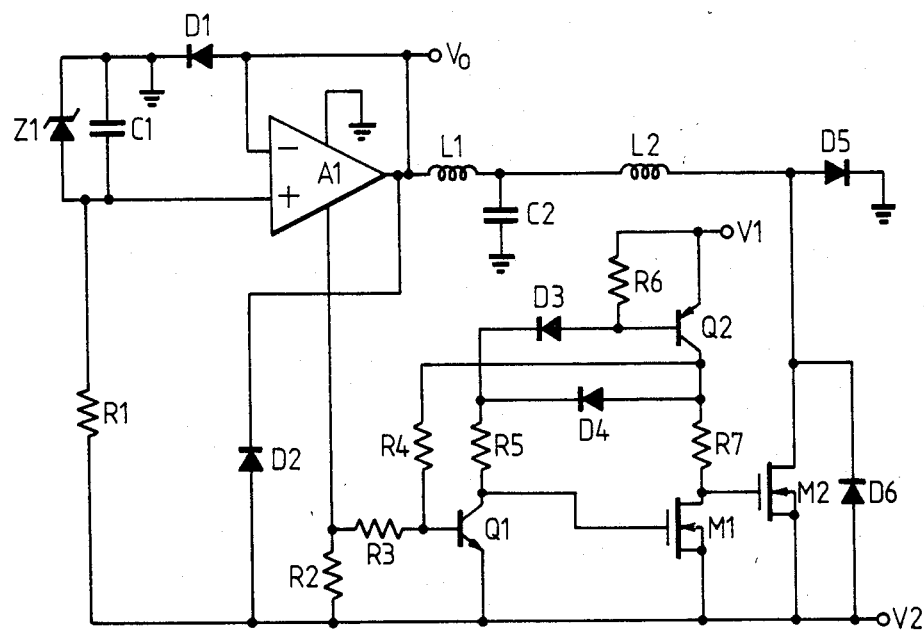
FIG. 10 is a circuit diagram of a negative-voltage regulator which is an embodiment of the invention.

The circuit diagram of a high-efficiency negative-voltage switching regulator which is an embodiment of the invention is shown in FIG. 10. The regulator has a reference voltage determined from a negative voltage source V2 by the capacitor C1, the resistor R1, and the Zener diode Z1. The reference voltage is applied to the positive input of the operational amplifier A1. The power input terminals of this amplifer are connected to earth, and resistor R2. This resistor senses the current flowing to the negative voltage V2; this current is approximately equal to the output current of A1. When the output current is low, bipolar transistors Q1 and Q2 together with MOS transistor M2 are off, and MOS transistor M1 is on. If the current increases sufficiently, the conduction states of the transistors reverse and transistor M2 passes current from the amplifer output via the coupling network (comprising capacitor C2, and inductors L1 and L2) to the negative voltage source V2. The coupling network limits the time rate of change of the current flow. As the current in M2 increases, the current in R2 becomes small, and hence M2 is eventually switched off. When M2 is off, diodes D5 and D6 limit the voltage swing at the drain of M2 to a safe value and maintain current flow in L2. Resistors R3 and R4 provide hysteresis in the transfer characteristic. The collector current of Q1 is set by R5 and the voltage source V1 whose potential is more positive than V2. Diodes D3 and D4 avoid saturation of Q2, and resistor R7 limits the peak current in Q2 to a safe value. Diodes D1 and D2 protect the output of A1 from any excessive voltage swing. In this embodiment the operational amplifier is connected for unity gain so the regulator output $v_o$ is approximately equal to the Zener voltage.

Figure 11:
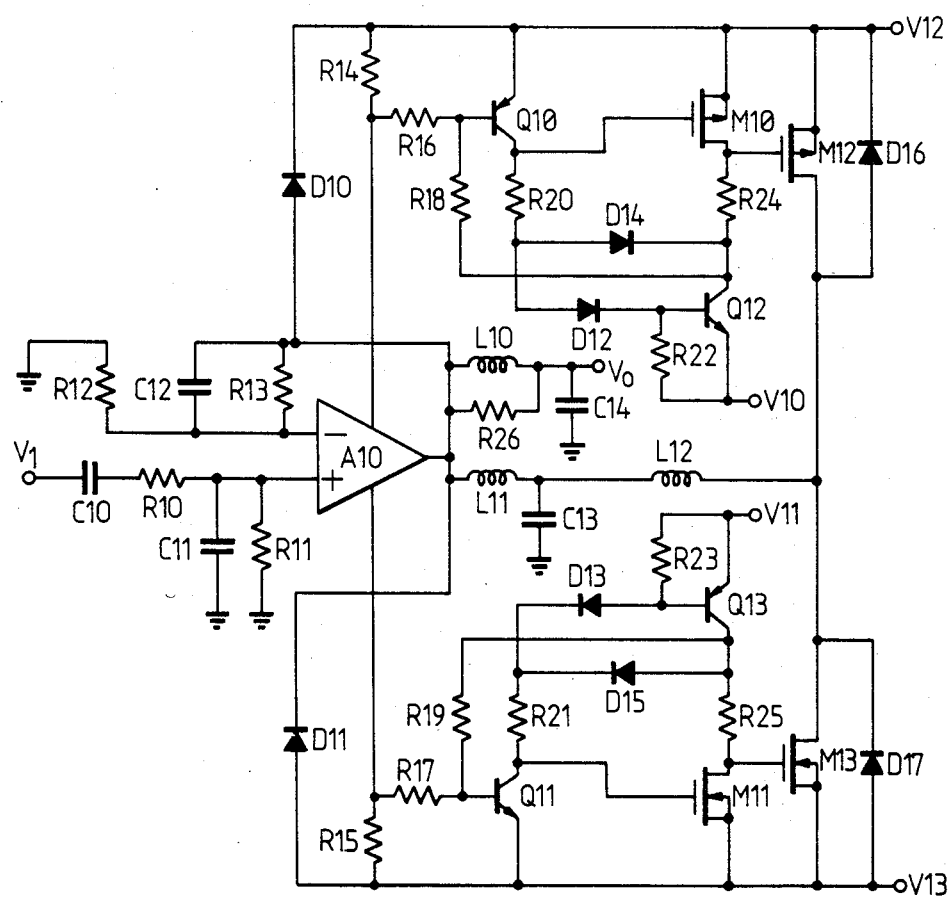
FIG. 11 is a circuit diagram of an audio power amplifier which is an embodiment of the invention.

The circuit diagram of an audio power amplifier which is an embodiment of the invention is shown in FIG. 11. The amplifier has an input signal $v_i$ which is ac coupled via capacitor C10 to a low-pass filter composed of capacitor C11, and resistors R10 and R11. The filtered signal passes to the positive input of operational amplifier A10. This amplifier is powered from a positive voltage source V12 and a negative voltage source V13, via resistors R14 and R15. These resistors sense the operational-amplifier output current. When the output current is low, bipolar transistors Q10 and Q11 are both off, but if the current increases sufficiently either Q10 or Q11 turns on. As a result, MOS transistor M12 or M13 turns on (the operation of the switching circuits is similar to that for the switching regulator just described and consequently is not considered further) thus passing current via the coupling network (comprising capacitor C13, and inductors L11 and L12) to or from the power-amplifier output whose voltage is $v_o$. Resistor R12 in conjunction with R13 sets the gain of the amplifier (the gain is also slightly dependent on R10 and R11). Capacitor C12 provides lead compensation of the feedback amplifier. A low-pass filter at the amplifier output (composed of capacitor C14, inductor L10, and resistor R26) decouples the amplifier load from the negative-feedback loop at high frequencies.

We claim:

1. A high-efficiency low-distortion parallel regulator system comprising a high-efficiency switching circuit having a control input and an output, a low-distortion linear-amplification means having an output, a coupling network, a coupling node and a system output port, wherein a reference voltage is generated within said linear-amplification means, an output voltage signal which is a function of the reference voltage is produced at the output of the linear-amplification means and is adapted to be fed to a load via the system output port, a signal which is a function of a current flowing in the output of the linear-amplification means is used to control the switching circuit, via the control input and a switching output current flowing in the output of the switching circuit is fed predominantly to the coupling node which is disposed between the output of the linear-amplification means and the system output port, at which node the switching output current is combined with the current flowing in the output of the linear-amplification means to produce a system output current which flows via the system output port to the load, the coupling network being connected so as to limit the maximum time rate of change of the switching output current and said coupling network having high output impedance at high frequencies, and the regulator system being further characterised in that the system output current when averaged over a period of time is substantially supplied by the switching circuit when said averaged output current is large.

2. The regulator system as claimed in claim 1, wherein the coupling network is incorporated into the switching circuit.

3. The regulator system as claimed in claim 1, wherein the coupling network is disposed between the output of the switching circuit an the coupling node.

4. The regulator system as claimed in claim 1, wherein said linear-amplification means incorporates a negative-feedback loop which includes said coupling node.

5. The regulator system as claimed in claim 1, wherein said linear-amplification means incorporates multiple feedback loops which include said coupling node.

6. The regulator system as claimed in claim 1, wherein said switching-circuit means incorporates hysteresis in its transfer characteristic.

7. The regulator system as claimed in claim 1, wherein a plurality of switching circuits are provided in parallel connection, the output current of each switching circuit being fed predominantly to said coupling node and having a maximum time rate of change limited by a coupling network and said coupling network having high output impedance at high frequency.

8. The regulator system as claimed in claim 1, wherein a filter means is incorporated between said coupling node and said system output port.

9. The regulator system as claimed in claim 8, wherein the filter means and the linear-amplification means share a common negative-feedback loop.

10. The regulator system as claimed in claim 1, wherein two filter means are incorporated in series between said coupling node and said system output port, one filter means and the linear-amplification means sharing a common negative-feedback loop.

11. A high-efficiency low-distortion parallel regulator system comprising a high-efficiency switching circuit having a control input and an output, a low-distortion linear-amplification means having an input and an output, a coupling network, a coupling node and a system output port, wherein a regulator reference voltage is fed to the input of the linear-amplification means, an output voltage signal which is a function of the reference voltage is produced at the output of the linear-amplification means and is adapted to be fed to a load via the system port, a signal which is a function of a current flowing in the output of the linear-amplification means is used to control the switching circuit via the control input, and a switching output current flowing in the output of the switching circuit is fed predominantly to the coupling node which is disposed between the output of the linear-amplification means and the system output port, at which node the switching output current is combined with the current flowing in the output of the linear-amplification means to produce a system output current which flows via the system output port to the load, the coupling network being connected so as to limit the maximum time rate of change of the switching output current and said coupling network having high impedance at high frequencies, and the regulator system being further characterized in that the system output current when averaged over a period of time is substantially supplied by the switching circuit when said averaged output current is large.

12. The regulator system as claimed in claim 11, wherein the coupling network is incorporated into the switching circuit.

13. The regulator as claimed in system claim 11, wherein the coupling network is disposed between the output of the switching circuit and the coupling node.

14. The regulator system as claimed in claim 11, wherein said linear-amplification means incorporates a filter means to attenuate undesirable signals entering the input of the linear-amplification means.

15. The regulator system as claimed in claim 11, wherein said linear-amplification means incorporates a negative-feedback loop which includes said coupling node.

16. The regulator system as claimed in claim 11, wherein said linear-amplification means incorporates multiple feedback loops which include said coupling node.

17. The regulator system as claimed in claim 11, wherein said switching-circuit means incorporates hysteresis in its transfer characteristics.

18. The regulator system as claimed in claim 11, wherein a plurality of switching circuits are provided in parallel connection, the output current of each switching circuit being fed predominantly to said coupling node and having a maximum time rate of change limited by a coupling network and said coupling network having high output impedance at high frequencies.

19. The regulator system as claimed in claim 11, wherein a filter means is incorporated between said coupling node and said system output port.

20. The regulator system as claimed in claim 14, wherein the filter means and the linear-amplification means share a common negative-feedback loop.

21. The regulator system as claimed in claim 11, wherein two filter means are incorporated in series between said coupling node and said system output port, one filter means and the linear-amplification means sharing a common negative-feedback loop.

22. A high-efficiency low-distortion parallel amplified system comprising a high-efficiency switching circuit having a control input and an output, a low-distortion linear-amplification means having an input and an output, a coupling network, a coupling node and a system output port, wherein a system input signal is fed to the input of the linear-amplification means, an output voltage signal which is a linear function of the system input signal is produced at the output of the linear-amplification means and is adapted to be fed to a load via the system output port, a signal which is a function of a current flowing in the output of the linear-amplification means is used to control the switching circuit via the control input, and a switching output current flowing in the output of the switching circuit is fed predominantly to the coupling node which is disposed between the output of the linear-amplification means and the system output port, at which node the switching output current is combined with the current flowing in the output of the linear-amplification means to produce a system output current which flows via the system output port to the load, the coupling network being connected so as to limit the maximum time rate of change of the switching output current and said coupling network having high output impedance at high frequencies, and the amplifier system being further characterized in that the system output current when averaged over a period of time is substantially supplied by the switching circuit when said averaged output current is large.

23. The amplifier system as claimed in claim 22, wherein the coupling network is incorporated into the switching circuit.

24. The amplifier system as claimed in claim 22, wherein the coupling network is disposed between the output of the switching circuit and the coupling node.

25. The amplifier system as claimed in claim 22, wherein said linear-amplification means incorporates a filter means to attenuate undesirable signals entering the input of the linear-amplification means.

26. The amplifier system as claimed in claim 22, wherein said linear-amplification means incorporates a negative-feedback look which includes said coupling node.

27. The amplifier system as claimed in claim 22, wherein said linear-amplification means incorporates multiple feedback loops which include said coupling node.

28. The amplifier system as claimed in claim 22, wherein said switching-circuit means incorporates hysteresis in its transfer characteristics.

29. The amplifier system as claimed in claim 22, wherein a plurality of switching circuits are provided in parallel connection, the output current of each switching circuit being fed predominantly to said coupling node and having a maximum time rate of change limited by a coupling network and said coupling network having high output impedance at high frequencies.

30. The amplifier system as claimed in claim 22, wherein a filter means is incorporated between said coupling node and said system output port.

31. The amplifier system as claimed in claim 30, wherein the filter means and the linear-amplification means share a common negative-feedback loop.

32. The amplifier system as claimed in claim 22, wherein two filter means are incorporated in series between said coupling node and said system output port, one filter means and the linear-amplification means sharing a common negative-feedback loop.

* * * * *